United States Patent Office 3,202,508
Patented Aug. 24, 1965

3,202,508

IMAGE PHOTOPOLYMERIZATION TRANSFER PROCESS

Robert Bernard Heiart, Middletown, N.J., assignor to E. I. du Pont de Nemours and Company, Wilmington, Del., a corporation of Delaware No Drawing. Filed July 13, 1961, Ser. No. 123,651
17 Claims. (Cl. 96—28)

This invention relates to processes of image reproduction. More particularly, it relates to processes wherein images are formed by photopolymerization techniques. Still more particularly, it relates to improved processes wherein the underexposed complementary image areas are transferred to an image-receptive support at normal atmospheric conditions and room temperature.

Various processes for producing copies of an image embodying thermal transfer are known. In one of the commercially promising processes, the thermal transfer is accomplished in a wet system or one where water-yielding materials are present in addition to light-sensitive materials. Dry thermal processes for producing image copy which utilize a photopolymerizable stratum have recently been developed. These processes, however, like other addition-polymerization reactions, are inhibited by oxygen in the air. To overcome the effect of oxygen, it is necessary to expose the photopolymerizable stratum to a relatively high intensity source of actinic radiation and/or expose the photopolymerizable stratum under conditions of reduced pressures of oxygen. An improved dry thermal image transfer process utilizes a removable cover sheet in intimate contact, at least during exposure, with the photopolymerizable stratum. The cover sheet is capable of uniformly transmitting actinic radiation and has a low permeability to oxygen. Lower intensity exposures and/or exposures at normal atmospheric pressures are thereby possible.

An object of this invention is to provide new and more practical processes for forming images by photopolymerization. Another object is to provide such processes which are simple and dependable. A further object is to provide such processes which utilize simple and economical apparatus. A still further object is to provide such processes which give excellent results with conventional exposure at normal atmospheric conditions with relatively low intensity illumination. A specific object of this invention is to provide a process wherein the entire process of exposing and transferring the image can be carried out at room temperature. Still further objects will be apparent from the following description of the invention.

The above objects are accomplished in the image reproduction processes of this invention which in their broader aspects comprise exposing with actinic radiation, imagewise, a stratum of a photopolymerizable composition, said stratum having a stick temperature below 30° C. and comprising a non-gaseous ethylenically unsaturated compound containing at least one terminal ethylenic group, e.g., 1 to 4 terminal ethylenic groups, having a boiling point above 100° C. at normal atmospheric pressure, and being capable of forming a high polymer by free-radical initiated, chain-propagating addition polymerization, and in intimate contact with said stratum, at least during the exposure, a removable cover sheet capable of uniformly transmitting actinic radiation and having low permeability to oxygen, until polymerization with an accompanying increase in said stick temperature of said unsaturated compound occurs in the exposed image areas without substantial polymerization and increase in stick temperature in the underexposed, complementary, adjoining coplanar image areas, removing the cover sheet, pressing the resulting exposed surface of said stratum into contact with the surface of an image-receptive support at room temperature and separating the two surfaces whereby an image corresponding to the underexposed image areas is transferred to the surface of the image-receptive support.

The term "underexposed" as used herein is intended to cover the image areas which are completely unexposed or those exposed only to the extent that there is addition polymerizable compound still present in sufficient quantity that the softening temperature remains substantially lower than that of the complementary exposed image areas. The term "stick temperature," as applied to either an underexposed or exposed area of a photopolymerizable stratum, means the minimum temperature at which the image area in question sticks or adheres (transfers), within 5 seconds, under slight pressure, e.g., thumb pressure, to analytical paper (Schleicher & Schull analytical filter paper No. 595) and remains adhered in a layer of at least detectable thickness after separation of the analytical paper from the stratum.

The photopolymerizable compositions contain 0 to 80% by weight, generally 2 to 50% by weight, based on the weight of the photopolymerizable monomer, e.g., ethylenically unsaturated compound, of a viscosity modifier such as polymeric compounds, inorganic fillers, plasticizers, high-boiling solvents, etc., to adjust the viscosity of the liquid composition thereby providing for greater ease of handling. Preferably the photopolymerizable compositions also contain a free-radical generating addition polymerization initiator in amounts ranging from 0.001 to 10 parts by weight per 100 parts by weight of the total weight of components in the photopolymerizable composition. An addition polymerization inhibitor, 0.001 to 2 parts by weight per 100 parts by weight of the total weight of components in the photopolymerizable compositions can also be present.

As previously indicated above, a removable cover sheet is placed in intimate contact with the photopolymerizable stratum at least during the exposure step. In view of the general low viscosity of the photopolymerizable composition, the removable cover sheet is usually placed on the element at manufacture. The cover sheet must be capable of uniformly transmitting actinic radiation and have a low permeability to oxygen in order to achieve a photopolymerizable element having a maximum degree of sensitivity to the radiation. A film sheet of polyethylene terephthalate makes a suitable removable cover sheet. In addition, other suitable materials include transparent films, such as regenerated cellulose, cellulose esters, e.g., cellulose acetate, cellulose propionate, etc., other polyesters, e.g., polypropylene terephthalate, polyethylene terephthalate-isophthalate copolymer, polycarbonate, etc.; polyethylene; polypropylene; polyvinylidene chloride; polyacrylonitile; polyvinyl alcohol, etc.; rigid materials, e.g., glass, polyacrylic acid esters, e.g., polymethyl acrylate and polyethylmethacrylate; certain coated transparent or translucent papers, e.g., wax paper, etc. The cover sheet may be used to add additional information to the image that is to be transferred, e.g., graphs and other detail. The cover sheet may also be colored but must be capable of transmitting radiation of the wave length to which the photopolymerizable element is sensitive.

Imagewise exposure in the above-described invention can be made through a stencil, line or halftone negative or positive or other suitable transparency and can be either by contact or projection exposure. Alternatively, reflectographic exposure techniques may also be employed. Sufficient imagewise exposure to actinic radiation is given until substantial addition polymerization takes place in the exposed areas to form an addition polymer and significantly less polymerization takes place in the underexposed areas.

While the addition polymerizable component present in the underexposed areas of the photopolymerizable element can be any monomeric ethylenically unsaturated compound capable of polymerizing or forming a high polymer in a short time by photoinitiated addition polymerization as disclosed in Plambeck U.S. Patent 2,760,-863, the particularly useful compounds fall within a general class, namely, normally non-gaseous (i.e., at 20° C. and atmospheric pressure) ethylenically unsaturated monomeric compounds having at least one terminal ethylenic group and a normal boiling point above 100° C.

In practicing a preferred embodiment of the invention a photopolymerizable element having an image-yielding stratum of the above components is laminated to a removable cover sheet capable of uniformly transmitting actinic radiation and having a low permeability to oxygen by contacting the surfaces of the cover sheet and the image-yielding stratum and pressing the surfaces together. The laminated element is exposed to actinic radiation reflectographically to a reflective surface bearing a light-absorbing message or through a photographic process transparency, e.g., a photographic positive, negative, half-tone, or a light-transmitting paper, and, after the exposure, the cover sheet is removed. The exposed image-yielding stratum is then brought into intimate contact under pressure with the surface of an image-receptive support, e.g., paper, metal, synthetic polymer, screen, etc., at room temperature and the surfaces are separated. The photopolymerizable composition is transferred to the paper, metal, etc., support in the areas corresponding to the underexposed, transferable areas to give at least one copy of the original image. Multiple copies can be obtained by repeating the room temperature transfer procedure using appropriate coating thicknesses of the photosensitive layer and pressures to give the desired number of copies.

As indicated above, the viscosity modifiers may be thickening agents which can be employed to increase the viscosity of the photopolymerizable composition so as to make it easier to prepare coated photopolymerizable elements. Suitable thickening agents include polymeric materials, inorganic fillers and the like. Preferably the thickening agents are thermoplastic polymers, e.g., (A) Copolyesters, e.g., those prepared from the reaction product of a polymethylene glycol of the formula $HO(CH_2)_nOH$, wherein $n$ is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids.

(B) Nylons or polyamides, e.g., N-methoxymethyl polyhexamethylene adipamide;

(C) Vinylidene chloride copolymers, e.g., vinylidene chloride/acrylonitrile; vinylidene chloride/methylacrylate and vinylidene chloride/vinylacetate copolymers;

(D) Ethylene/vinyl acetate copolymers;

(E) Cellulosic ethers, e.g., methyl cellulose, ethyl cellulose and benzyl cellulose;

(F) Polyethylene;

(G) Synthetic rubbers, e.g., butadiene/acrylonitrile copolymers, and chloro-2-butadiene-1,3 polymers;

(H) Cellulose esters, e.g., cellulose acetate, cellulose acetate succinate and cellulose acetate butyrate;

(I) Polyvinyl esters, e.g., polyvinyl acetate/acrylate, polyvinyl aceate/methacrylate and polyvinyl acetate;

(J) Polyacrylate and alpha-alkyl polyacrylate esters, e.g., polymethyl methacrylate and polyethyl methacrylate;

(K) High molecular weight polyethylene oxides of polyglycols having average molecular weights from about 4,000 to 1,000,000;

(L) Polyvinyl chloride and copolymers, e.g., polyvinyl chloride/acetate;

(M) Polyvinyl acetal, e.g., polyvinyl butyral, polyvinyl formal;

(N) Polyformaldehydes;

(O) Polyurethanes;

(P) Polycarbonates (Q) Polystyrenes.

To the photopolymerizable composition there can also be added non-thermoplastic polymeric compounds to improve certain desirable characteristics, e.g., adhesion to the base support, adhesion to the image-receptive support on transfer, wear properties, chemical inertness, etc. Suitable non-thermoplastic polymeric compounds include polyvinyl alcohol, cellulose, anhydrous gelatin, phenolic resins and melamineformaldehyde resins, etc. If desired, the photopolymerizable layers can also contain immiscible polymeric or non-polymeric organic or inorganic fillers or reinforcing agents which are essentially transparent at the wave lengths used for the exposure of the photopolymeric material, e.g., the organophilic silicas, bentonites, colloidal silica, powdered glass, colloidal carbon, as well as various types of dyes and pigments. Such materials are used in amounts varying with the desired properties of the photopolymerizable layer. The fillers are useful in improving the strength of the composition, reducing tack and, in addition, as coloring agents.

Suitable free-radical initiated, chain-propagating addition polymerizable ethylenically unsaturated monomeric compounds for use in this invention include preferably an alkylene or a polyalkylene glycol diacrylate prepared from an alkylene glycol of 2 to 15 carbons or a polyalkylene ether glycol of 1 to 10 ether linkages, and those disclosed in Martin & Barney U.S. Patent 2,927,022, issued March 1, 1960, e.g., those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen and sulfur. Outstanding are such materials wherein the ethylenically unsaturated groups, especially the vinylidene groups, are conjugated with ester or amide structures. The following specific compounds are further illustrative of this class: unsaturated esters of alcohols, preferably polyols and particularly such esters of the alphamethylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetraacrylate, pentaerythritol tetramethacrylate, dipentaerythritol hexaacrylate, 1,3-propanediol diacrylate, 1,5-pentanediol dimethacrylate, the bis-acrylates and methacrylates of polyethylene glycols of molecular weight 200–500, and the like; unsaturated amides, particularly those of the alphamethylene carboxylic acids, and especially those of alpha, omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine trismethacrylamide, bis(gamma-methacrylamidopropoxy)ethane beta-methacrylamidoethyl methacrylate, N-(beta-hydroxyethyl)-beta-(methacrylamido)ethyl acrylate and N,N-bis(beta-methacrylyloxyethyl), acrylamide; vinyl esters such as divinyl succinate, divinyl adipate, divinyl phthalate, divinyl terephthalate, divinyl benzene-1,3-disulfonate, and divinyl butane-1,4-disulfonate; styrene and derivatives thereof and unsaturated aldehydes, such as sorbaldehyde (hexadienal). An outstanding class of these preferred addition polymerizable components are the esters and amides of alpha-methylene carboxylic acids and substituted carboxylic acids with polyols and polyamides wherein the molecular chain between the hydroxyls and amino groups is solely carbon or oxygen-interrupted carbon. The preferred monomeric compounds are difunctional, but monofunctional or polyfunctional monomers can also be used. The amount of monomer added varies with the particular polymers used.

The polymerizable monomers listed in the above paragraph which are normally solid and non-tacky at room temperature can be used according to the present invention when they are present in combination with viscosity modifiers which lower viscosity, e.g., plasticizers or high-boiling solvents, so that they become pressure-transferable at room temperature like the less viscous or tacky monomeric compounds. Suitable plasticizers include low molecular weight polyalkylene oxides, ethers and esters, e.g., triethylene glycol dicaprylate, polypropylene glycol mono-n-butyl ether; and other esters such as phthalates, e.g., dibutyl phthalate; adipates, e.g., diisobutyl adipate; sebacates, e.g., dimethyl sebacate. In addition, phosphates, e.g., tricresyl phosphate; amides and sulfonamides, e.g., n-ethyl-p-toluenesulfonamide; carbonates, e.g., bis(dimethylbenzyl) carbonate; citrates, e.g., triethyl citrate; glycerol esters, e.g., glycerol triacetate; laurates, e.g., n-butyl laurate; oleates, stearates, etc., are also useful.

A preferred class of free-radical generating addition polymerization initiators activatable by actinic radiation includes the substituted or unsubstituted polynuclear quinones which are compounds having two intracyclic carbonyl groups attached to intracyclic carbon atoms in a conjugated carbocyclic ring system. Suitable such initiators include 9,10-anthraquinone, 1-chloroanthraquinone, 2-chloroanthraquinone, 2-methylanthroquinone, 2-ethyl-anthraquinone, 2-tert-butylanthraquinone, octamethylanthraquinone, 1,4-naphthaquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alphasulfonic acid, 3-chloro-2-methylanthraquinone, retenequinone, 7,8,9,10-tetrahydronaphthacenequinone, and 1,2,3,4-tetrahydrobenz[a]anthracene-7,12-dione. Other useful photoinitiators include those described in Plambeck U.S. Patent 2,760,863 include vicinal ketaldonyl compounds, such as diacetyl, benzil, etc.; α-ketaldonyl alcohols, such as benzoin, pivaloin, etc., acyloin ethers, e.g., benzoin methyl and ethyl ethers, etc.; α-hydrocarbon substituted aromatic acyloins, including α-methylbenzoin, α-allylbenzoin, and α-phenylbenzoin.

Suitable polymerization inhibitors that can be used in photopolymerizable compositions include p-methoxyphenol, hydroquinone, and alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene, dinitrobenzene, iodine and sulfur. Other useful inhibitors include p-toluquinone and chloranil, and thiazine dyes, e.g., Thionine Blue G(CI 52025), Methylene Blue B (CI 52015) and Toluidine Blue O (CI 52040).

Various dyes, pigments, thermographic compounds and color forming components can be added to the photopolymerizable compositions to give varied results after the transfer step. These additive materials, however, preferably should not absorb excessive amounts of radiation at the exposure wave length or inhibit the polymerization reaction.

Among the dyes useful in the invention are Fuchsine (CI 42510), Auramine Base (CI 41000B), Calcocid Green S(CI 44090), Para Magenta (CI 42500), Tryparosan (CI 42505), New Magenta (CI 42520), Acid Violet RRL (CI 42425), Red Violet 5RS (CI 42690), Nile Blue 2B (CI 51185), New Methylene Blue GG (CI 51195), CI Basic Blue 20 (CI 42585), Iodine Green (CI 42556), Night Green B (CI 42115), CI Direct Yellow 9 (CI 19540), CI Acid Yellow 17 (CI 18965), CI Acid Yellow 29 (CI 18900), Tartrazine (CI 19140), Supramine Yellow G (CI 19300), Buffalo Black 10B (CI 27790), Naphthalene Black 12R (CI 20350), Fast Black L (CI 51215), and Ethyl Violet (CI 42600).

The abbreviation CI refers to the Colour Index, 2nd Edition, The Society of Dyers and Colourists, Dean House, Picadilly, Bradford, Yorkshire, England, 1956, and The American Association of Textile Chemists and Colorists, Lowell Technological Institute, Lowell, Massachusetts, U.S.A.

Suitable pigments include, e.g., $TiO_2$, colloidal carbon, graphite, phosphor particles, ceramics, clays, metal powders, such as aluminum, copper magnetic iron and bronze, etc. The pigments are useful when placed in the photosensitive layer or in an adjacent nonphotosensitive layer.

Suitable color-forming components which form colored compounds on the application of heat or when brought in contact with other color-forming components on a separate support include, (1) Organic and inorganic components: Dimethyl glyoxime and nickel salts; phenolphthalein and sodium hydroxide; starch/potassium iodide and oxidizing agent, i.e., peroxides; phenols and iron salts; thioacetamide and lead acetate; silver salt and reducing agent, e.g., hydroquinone.

(2) Inorganic components: Ferric salts and potassium thiocyanate; ferrous salts and potassium ferricyanide; copper or silver salts and sulfide ions; lead acetate and sodium sulfide.

(3) Organic components: 2,4-dinitrophenylhydrazine and aldehydes or ketones; diazonium salt and phenol or naphthol, e.g., benzene diazonium chloride and β-naphthol; p-dimethylaminobenzaldehyde and p-diethylaminoaniline.

The photopolymerizable composition is preferably coated on a support. Suitable supports include those disclosed in U.S. Patent 2,760,863, glass, paper (including waxed or transparentized paper), cellulose esters, e.g., cellulose acetate, cellulose propionate, cellulose butyrate, etc., and other plastic compositions such as polyamides, polyesters, etc. The support may have in or on its surface and beneath the photopolymerizable stratum an antihalation layer as disclosed in said patent or other substrata needed to facilitate anchorage to the base.

The image-receptive support to which the image is transferred is dependent on the desired use for the transferred image and on the adhesion of the image to the base. Suitable supports include paper including bond paper, resin and clay sized paper, resin coated or impregnated paper, carboard, metal sheets and foils, e.g., aluminum, copper, steel, bronze, etc.; wood, glass, nylon, rubber, polyethylene, linear condensation polymers such as the polyesters, e.g., polyethylene terephthalate, regenerated cellulose and cellulose esters, e.g., cellulose aacetate, silk, cotton and viscose rayon fabrics or screens.

The receptive support may have a hydrophilic surface or may contain on its surface chemical compounds which react with compounds being transferred so as to produce differences in color, hydrophilicity or conductivity between the exposed and underexposed areas or for improved adhesion or brightening of the receptive support. The image-receptive surface may be smooth, contain roughening agents such as silica, be perforated or be in the form of a mesh or screen.

Prior to the transfer of a portion of the photopolymerizable layer in the underexposed areas, the layer protected by the cover sheet, is exposed to actinic radiation. This may be through a two-tone image or a process transparency, e.g., a process negative or positive (an image-bearing transparentcy consisting solely of substantially opaque and substantially transparent areas where the opaque areas are substantially of the same optical density, the so-called line or halftone negative or positive). The image or transparency may or may not be in operative contact with the protective cover sheet, i.e., the exposure may be by contact or by projection. It is possible to expose through paper or other light transmitting materials. A stronger radiation source or longer exposure times must be used, however.

Reflex exposure techniques are especially useful in the present invention, particularly when office copies are made. By using reflex exposure, copies can be made from materials having messages on both sides of a page or from opaque supports, e.g., paper, cardboard, metal, etc., as well as from poor light-transmitting surfaces with no loss in speed, excellent resolution, and, in addition, right reading copies are obtained directly on transfer.

Since free-radical generating addition-polymerization initiators activatable by actinic radiation generally exhibit their maximum sensitivity in the ultraviolet range, the radiation source should usually furnish an effective amount of this radiation. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs, particularly the sunlamp type, and the fluorescent sunlamps, are most suitable. The sunlamp mercury-vapor arcs are customarily used at a distance of one and one-half to 20 inches from the photopolymerizable layer. It is noted, however, that in certain circumstances it may be advantageous to expose with visible light, using a photoinitiator sensitive in the visible region of the spectrum, e.g., 9,10-phenanthrenequinone. In such cases, the radiation source should furnish an effective amount of visible radiation. Many of the radiation sources listed above furnish the required amount of visible light.

After the exposure of the photopolymerizable layer and removal of the cover sheet, the exposed composition is brought into intimate contact with the receptive support at room temperature, while pressure is applied to effect the transfer of the underexposed areas of the photopolymerizable composition. Pressure can be applied by means well known to the art, e.g., rollers, flat or curved surfaces or platens, etc. In general, 0.1 seconds is adequate and shorter periods of contact are possible since time is not critical.

Lamination of the cover sheet to the photopolymerizable stratum may occur at the time of preparation of the element, immediately prior to exposure, or anytime therebetween. Lamination is effected most easily when the photopolymerizable stratum is coated on a flexible support and when the cover sheet is also flexible. In such a case the cover sheet can be laid over the surface of the photopolymerizable element and the two elements laminated by passing between pairs of rollers. Satisfactory results are obtained, however, when either or both the cover sheets and the support for the photopolymerizable stratum are of a non-flexible material, e.g., glass. In the case of a glass cover sheet, a parting layer can be placed between the cover sheet and the photopolymerizable layer. With a nonflexible element, some other means of applying a uniform pressure may be required, such as a single, hand-operated roller. The laminating pressure is not particularly critical; it should be sufficient to bring about good contact between the surfaces to be laminated but not sufficient to damage the material.

The invention will be further illustrated by, but is not intended to be limited to, the following detailed examples.

*Example I*

The following solution was prepared:

24.0 g. polyethylene glycol diacrylate
24 mg. p-methoxyphenol
6.0 g. cellulose acetate butyrate
93 mg. phenanthrenequinone
60 mg. Calcocid Green S Ex Conc. Dye (CI 44090)
Acetone to bring the solution weight to 185 g.

The cellulose acetate butyrate contained ca. 13% acetyl groups, ca. 37% butyryl groups and had a viscosity of 64 to 124 poises as determined by A.S.T.M. method D-871-54T in solution described as Formula A, A.S.T.M. method D-871-54T. The polyethylene glycol diacrylate was derived from polyethylene glycol with an average molecular weight of 300.

This solution was coated onto a 1-mil thick polyethylene terephthalate film to a wet thickness of six mils. The coating was allowed to stand in air for 20 minutes while the solvent evaporated, leaving a viscous, syrupy layer. A second sheet of 1-mil thick polyethylene terephthalate film was then rolled onto the coating as a cover sheet, taking care to exclude air bubbles. The laminated element was exposed through a transparency bearing a line and letter text image for 5 seconds to a General Electric Company Type RSP 2 Photospot lamp supported 2 feet away. The cover sheet was then peeled from the coating, and the exposed photopolymerizable layer was placed in contact with a piece of bond receptor paper and pressed firmly against it by hand. The layer was then removed from the paper leaving a well-defined image of the original transferred to the receptor paper. Three more copies were made from the same exposed photopolymer layer by repeating the image transfer operations.

*Example II*

Example I was repeated except that the polyethylene terephthalate cover sheet was replaced by (a) 1-mil thick untreated regenerated cellulose, (b) 0.5-mil thick polyvinyl fluoride, (c) a glass plate 1/16" thick. Results similar to those of Example I were obtained.

*Example III*

A solution was prepared containing 4.5 g. polyvinyl acetate resin which when dissolved in benzene in a concentration of 86 g. of resin per 1000 cc. of solution has a viscosity of 700-900 centiposes at 20° C. as measured with an Ostwald viscosimeter.
5.5g. triethylene glycol diacrylate
5.5 g. p-methoxyphenol
16.0 mg. Calcocid Green S Ex Conc. Dye (CI 44090)
100 mg. anthraquinone
Acetone to 50.0 g.

This was coated and laminated with polyester film as in Example I.

The laminated element was exposed through a transparency bearing a line and letter text image for 30 seconds to a General Electric Type H 400-R1 400-watt mercury arc lamp at a distance of 10 inches. The cover film was removed, and the exposed photopolymerizable layer was placed in contact with a piece of bond receptor paper and pressed firmly against it by hand. The layer was then removed from the paper leaving a well-defined image of the original, transferred to the receptor paper.

*Example IV*

A solution was prepared containing 6.0 g. polyvinyl butyral resin having a butyral content of approximately 88% (expressed as percent polyvinyl butyral) and having a viscosity of ca. 350 in a 10% by weight solution in N-butanol at 25° C.
4.0 g. polyethylene glycol diacrylate
5.5 mg. p-methoxyphenol
30 mg. Calcocid Green S Ex Conc. Dye (CI 44090)
20 mg. benzoin methyl ether
Acetone to bring the solution weight to 50 g.

This solution was coated, 10 mils wet thickness, onto 1-mil thick regenerated cellulose and allowed to stand 20 minutes in subdued room lights until the solvent evaporated and a viscous syrupy layer remained. A second sheet of 1-mil thick regenerated cellulose was then rolled lightly onto the coating, care being taken to exclude air.

This sample was exposed through a transparency bearing line images to about 10 watt seconds/square cm. of ultraviolet light from an 1800-watt high-pressure mercury arc lamp. The cover film was then removed and the unpolymerized syrup transferred to a receptor paper by contact with hand pressure. A positive image of the transparency was produced in the paper.

*Example V*

A solution was prepared as in Example I except that the p-methoxyphenol was replaced by 30 mg. of $I_2$. A laminated coating was made as described in Example I. A sample of the coating was exposed reflectographically to a printed page for 10 seconds to a General Electric No. 2 Photoflood lamp 12 inches away. The cover film was removed and the transfer was carried out as in Example I. A positive image of the page was produced on the receptor sheet.

*Example VI*

A solution was prepared as in Example V using 30 mg. of $I_2$. The solution was placed in a flask and the solvent (acetone) removed by distillation at reduced pressure. A stripe of the syrup was laid down along one edge of a glass plate and a piece of 1-mil thick polyester film was placed over the entire plate. The stripe of syrup was then spread out between the plate and the film by means of a roller to form a photopolymer layer about 0.5 mil thick between the two transparent layers. The element so prepared was exposed reflectographically to a printed page for 13 seconds using a General Electric No. 2 Photoflood lamp, 12 inches away. The polyester film was removed and replaced by a piece of receptor paper which was pressed firmly against the exposed photopolymer layer. The receptor paper was then removed carrying with it a well-defined image of the original transferred from the exposed photopolymer layer. Several additional copies were made by repeating the transfer operations. The used matrix was then removed by scraping it from the glass plate and the entire cycle repeated. The need for a disposable substrate for the photopolymer element was thereby eliminated.

*Example VII*

A solution was prepared as follows:

24.0 g. polyethylene glycol diacrylate
24 mg. p-methoxyphenol
93 mg. phenanthrenequinone
60 mg. Calcocid Green S Ex Conc. Dye (CI 44090)

A portion of this solution was rolled out between two sheet of polyethylene terephthalate film, 1 mil thick, to form a photopolymerizable layer about 0.5 mil thick. This element was then exposed through a transparency bearing a line image for 10 second to the actinic radiation source described in Example I supported two feet away. The cover sheet was peeled from the coating and the image was transferred as described in Example I.

*Example VIII*

A thermoplastic photopolyerizable composition was prepared from 9 g. of low viscosity polyvinyl acetate methacrylate (containing a maximum of 20 mol percent of methacrylyl groups), 12 ml. of ethanol, 6 g. of a polyethylene glycol diacrylate of the type described in Example I, 0.009 g. of anthraquinone and 0.009 g. of p-methoxyphenol. To the photopolymerizable composition was added 0.18 g. of the blue-green dye, Calcocid Green S described in Example I, in 12 ml. of ethanol. The resulting solution was coated to a thickness of about 1 mil on a 1-mil thick polyethylene terephthalate film support. The coating was then laminated, exposed through a transparency, delaminated, pressed into contact with a bond paper receptor and removed from the paper as described in Example I, leaving a well-defined image of the original transferred to the receptor paper.

*Example IX*

A solution was prepared containing the following ingredients, stirring with an air motor at room temperature until complete solution was obtained:

7 g. triethylene glycol diacrylate
1 g. cellulose acetate (having 39.4% acetyl groups and having an ASTM viscosity of 45)
2 g. cellulose acetate butyrate (as described in Example I)
20 g. pentaerythritol tetraacrylate
100 mg. p-methoxyphenol
300 mg. phenanthrenequinone
200 mg. Calcocid Green S Ex. Conc. Dye (CI 44090)
Acetone to bring the solution weight to 150 g.

The solution was coated, dried, laminated, exposed for 3 seconds, delaminated, pressed into contact with a receptor surface and removed from said surface, essentially as described in Example I. There was left a well-defined image of the original transferred to the receptor paper.

The processes of the present invention are useful for a variety of copying, printing, decorative and manufacturing applications. Pigments, e.g., $TiO_2$, colloidal carbon, metal powders, phosphors, etc., and dyes which do not appreciably absorb light at the wave length being used for exposure or inhibit polymerization can be incorporated in the light-sensitive photopolymerizable layer, and by use of the instant process, images can be transferred to an image-receptive support. Multicopies of the process images can be obtained from the transferred image. The number of copies prepared is dependent on the photopolymerizable composition thickness as well as the process conditions. The process is also useful for preparing multicolor reproductions.

Lithographic surfaces can be produced by transferring a hydrophobic layer to a hydrophilic receptor surface or vice versa. The images on the lithographic surface can be made impervious to chemical or solvent attack by post-exposing the lithographic surface. Alternatively, the exposed areas of the photopolymerizable composition, after the underexposed areas are transferred, can be used as a lithographic-offset printing plate if they are hydrophobic and the original sheet support is hydrophilic or vice versa.

The transferred images are not only useful for making copies of the original image transparency by dry methods as indicated above but after transfer of the underexposed areas to a receptor support, the exposed surface can be treated with, e.g., aqueous solutions, dyes, inks, etc., to form colored images. Colored copies of the original image can be obtained when the wet surface is brought into intimate contact with a receptor support and the surfaces separated. Solvents which are used for the spirit copying, e.g., ethanol, water, should meter out the dye used and be a non-solvent for the polymer, i.e., the solubility of the dye and binder are important factors in selecting the solvent.

After exposure and removal of the cover sheet, the exposed photopolymerized stratum can be brought into intimate contact at room temperature with a separate support, e.g., a roll of carbon or graphite; a roll coated with pigment dispersions; a roll which has a continuously replenished pigment or inked surface; a separate support coated with pigments with or without dyes, color forming compounds, hydrophilic and hydrophobic surfaces or a metallized film. Upon removing the surfaces, the areas corresponding to the underexposed areas of the photopolymerized composition are transferred. A duplicate copy and a reverse copy are formed simultaneously.

The exposed photopolymerized surfaces are also useful with various dusting techniques, e.g., with finely divided dyes and pigments, the materials adhering in the underexposed areas. Multiple copies can be prepared. The dusted films are useful as filters, in the preparation of lithographic printing plates by using hydrophilic or hydrophobic materials, in the manufacture of printed circuits and electrically conducting or photoconductive matrices, in the preparation of two and multicolor reproductions and phosphor and ceramic patterns.

An advantage of this invention is that the processes are simple and dependable. Other advantages are the result of placing a removable cover sheet on the photopolymerizable stratum at least during the exposure step. By using a cover sheet, the concentration of atmospheric oxygen in contact with the surface of the photopolymerizable stratum at the time of imagewise exposure is materially reduced. The photopolymerizable element therefore has an increased sensitivity or speed to the actinic radiation, exhibits increased contrast and also exhibits an increase in the degree of polymerization, resulting in an increase in the difference of stick temperatures between the exposed and underexposed areas. A further advantage is that the tendency for "Reciprocity Law" failure, i.e., the dependence of stick temperature on radiation intensity at constant exposure, is reduced.

In addition, this invention has the advantages inherent in a room-temperature process, the most important of which is the simplification of the process and the apparatus for carrying out the process which is possible when no heating operation is required. A still further advantage is concerned with the dual function of the cover sheet which can act both as a means of overcoming inhibition due to oxygen and as an insulator sheet to protect the photopolymerizable composition and hold said composition in place. As practical results of these advantages, it is possible to eliminate the necessity of exposure in vacuum printing frames and to use simple and economical low intensity exposure sources. Furthermore, many materials can be used in the photopolymerizable stratum, when they can be protected with a cover sheet, which could not be used in the absence of this cover sheet. Still another advantage resulting from the reduced oxygen inhibition is the elimination of the surface effect whereby, even under optimum conditions, a thin surface layer after exposure is not completely polymerized. In the case of transfer of such an image to image-receptive surface, a "stain" or a slight undesired transfer of material from the exposed areas may occur.

A specific advantage of this invention is that it is readily adaptable to simple and effective image reproduction apparatus, e.g., of the type taught by assignee's Heiart application entitled "Apparatus," filed concurrently herewith, now U.S. Patent 3,085,488, issued April 16, 1963. In the apparatus means are provided for applying a stratum of a photopolymerizable composition onto a flat or curved surface capable of transmitting actinic radiation, e.g., a movable belt or rotatable cylinder; bringing into contact with the stratum at least during exposure a covering surface and separating the covering surface after exposure; imagewise exposing the stratum to actinic radiation; pressing the surface of the exposed stratum into contact with an image-receptive surface and separating the two surfaces thereby effecting a transfer in the underexposed image areas; and removing the remaining portion of the stratum from the flat or curved surface. The only materials expended are a portion of the photopolymerizable composititon and the image-receptive support.

Still further advantages will be apparent from the foregoing description of the invention.

What is claimed is:

1. In a process for reproducing an image at normal atmospheric conditions and room temperature from a stratum of a photopoylmerizable composition having a stick temperature below 30° C. and comprising a non-gaseous ethylenically unsaturated compound containing at least one terminal ethylenic group having a boiling point above 100° C. at normal atmospheric pressure and being capable of forming a high polymer by free-radical initiated, chain-propagating addition polymerization, which process comprises (1) exposing said stratum imagewise with actinic radiation, (2) pressing the resulting exposed surface of said stratum with the surface of an image-receptive support and (3) separating the two surfaces whereby an image corresponding to the underexposed image areas is transferred to the surface of the image-receptive support; the improvement comprising placing a removable cover sheet in intimate contact with said stratum prior to the exposing step, said cover sheet being capable of uniformly transmitting actinic radiation and having low permeability to oxygen, and removing said cover sheet after exposure and prior to said pressing step (2).

2. A process as defined in claim 1 wherein said ethylenically unsaturated compound is a diacrylate of a diol of the formula $$HO(CH_2CH_2O)_nH$$

where $n$ is an integer from 1 to 20.

3. A process as defined in claim 1 wherein said photopolymerizable composition contains a polymer having ethylenically unsaturated groups.

4. A process as defined in claim 1 wherein said photopolymerizable composition contains, based on the weight of said ethylenically unsaturated compound, 2 to 80 percent by weight of a viscosity modifying compound.

5. A process as defined in claim 4 wherein said photopolymerizable composition contains, per hundred parts by weight of said ethylenically unsaturated compound and said viscosity modifying compound, 0.001 to 10 parts by weight of a free-radical generating addition polymerization initiator activatable by actinic radiation.

6. A process as defined in claim 5 wherein said photopolymerizable composition contains, per hundred parts by weight of said ethylenically unsaturated compound and said viscosity modifying compound, 0.001 to 2.0 parts by weight of an addition polymerization inhibitor.

7. A process as defined in claim 1 wherein said photopolymerizable composition contains an ethylenically unsaturated compound liquid at normal atmospheric pressure and room temperature and 2 to 50 percent by weight, based on the weight of said ethylenically unsaturated compound, of a polymeric thickening agent.

8. A process as defined in claim 7 wherein said polymeric thickening agent is cellulose acetate butyrate.

9. A process as defined in claim 1 wherein said removable cover sheet is polyethylene terephthalate.

10. A process as defined in claim 1 wherein said imagewise exposure is through the stratum and by means of reflected light from an image-bearing medium placed beyond said stratum.

11. A process as defined in claim 1 wherein only partial transfer of the underexposed image areas occurs and said pressure-contacting and separating steps are repeated several times and a plurality of transferable images are obtained.

12. A process for reproducing an image from a photopolymerizable element at normal atmospheric conditions and room temperature which comprises exposing with actinic radiation, imagewise, said photopolymerizable element comprising a support bearing a stratum of a photopolymerizable composition and in intimate contact with said stratum, at least during the exposure, a removable cover sheet capable of uniformly transmitting actinic radiation and having low permeability to oxygen, said stratum having a stick temperature below 30° C. and comprising a non-gaseous ethylenically unsaturated compound containing at least one terminal ethylenic group, having a boiling point above 100° C. at normal atmospheric pressure, and being capable of forming a high polymer by free-radical initiated, chain-propagating addition polymerization, until polymerization with an accompanying increase in said stick temperature of said unsaturated compound occurs in the exposed image areas without substantial polymerization and increase in stick temperature in the underexposed, complementary, adjoining coplanar image areas, removing the cover sheet, applying finely divided solid particles of material to the resulting surface of said element, whereby the particles are preferentially adhered to the underexposed areas, removing the particles in the exposed areas, pressing the surface of the layer having finely divided particles adherent thereto into contact with the surface of an image-receptive support, and separating the image-receptive support from said layer whereby said particles and adherent portion of the underexposed image areas transfer to the surface of the image-receptive support.

13. A process for reproducing an image from a photopolymerizable element at normal atmospheric conditions and room temperature which comprises exposing with actinic radiation, imagewise, said photopolymerizable element comprising a support bearing a stratum of a photopolymerizable composition and in intimate contact with said stratum, at least during the exposure, a removable cover sheet capable of uniformly transmitting actinic radiation and having low permeability to oxygen, said stratum having a stick temperature below 30° C. and comprising a non-gaseous ethylenically unsaturated compound containing at least one terminal ethylenic group, having a boiling point above 100° C. at normal atmospheric pressure, and being capable of forming a high polymer by free-radical initiated, chain-propagating addition polymerization, until polymerization with an accompanying increase in said stick temperature of said unsaturated compound occurs in the exposed image areas without substantial polymerization and increase in stick temperature in the underexposed, complementary, adjoining coplanar image areas, removing the cover sheet, pressing a layer of finely divided discrete particles of material and which are loosely bound in said layer into contact with a resulting exposed surface of said element, and separating said surfaces whereby said particles are transferred to the surface of the resulting exposed element in the areas corresponding to the underexposed image areas.

14. A process for reproducing an image which comprises applying a stratum of a photopolymerizable composition on a surface capable of transmitting actinic radiation, said stratum having a stick temperature below 30° C. and comprising a non-gaseous ethylenically unsaturated compound containing at least one terminal ethylenic group, having a boiling point above 100° C. at normal atmospheric pressure, and being capable of forming a high polymer by free-radical initiated, chain-propagating addition polymerization, placing a removable cover sheet capable of uniformly transmitting actinic radiation and having low permeability to oxygen in intimate contact with said stratum, bringing a reflective image-bearing medium into contact with said cover sheet, exposing said stratum with actinic radiation through the stratum and by means of reflected light from said image-bearing layer beyond the stratum until polymerization with an accompanying increase in stick temepratuce of said unsaturated compound occurs in the exposed image areas without substantial polymerization and increase in stick temperature in the underexposed, complementary, adjoining coplanar image areas, removing said image-bearing layer and cover sheet, placing the resulting exposed stratum into contact with the surface of an image-receptive support and separating the two surfaces whereby an image corresponding to the underexposed image areas is transferred to the surface of the image-receptive support, and removing the remaining photopolymerized composition from said actinic radiation transmitting surface.

15. A process as defined in claim 14 wherein the actinic radiation transmitting surface is a rotatable cylinder.

16. A process as defined in claim 14 wherein the actinic radiation transmitting surface is a glass plate.

17. A process as defined in claim 14 wherein the actinic radiation transmitting surface is a flexible movable belt.

References Cited by the Examiner

UNITED STATES PATENTS

| | | | |
|---|---|---|---|
| 2,760,863 | 8/56 | Plambeck | 96—115 X |
| 2,903,964 | 9/59 | Taylor | 96—28 X |
| 3,060,023 | 10/62 | Burg et al. | 96—28 |
| 3,060,025 | 10/62 | Burg et al. | 96—28 |

FOREIGN PATENTS

| | | |
|---|---|---|
| 1,085,423 | 7/60 | Germany. |
| 1,106,172 | 5/61 | Germany. |

NORMAN G. TORCHIN, *Primary Examiner.*

HAROLD N. BURSTEIN, *Examiner.*